United States Patent [19]

Mefed et al.

[11] 4,124,813
[45] Nov. 7, 1978

[54] METHOD OF VIEWING NUCLEAR MAGNETIC RESONANCE

[76] Inventors: Anatoly E. Mefed, prospekt Mira, 22, kv. 54, Fryazino Moskovskoi oblasti; Vadim A. Atsarkin, ulitsa Baikalskaya, 23, kv. 36, Moscow, both of U.S.S.R.

[21] Appl. No.: 706,779

[22] Filed: Jul. 19, 1976

[30] Foreign Application Priority Data

Jul. 25, 1975 [SU] U.S.S.R. ............ 2152903[I]

[51] Int. Cl.² ............................................ G01R 33/08
[52] U.S. Cl. ................................ 324/0.5 A; 324/0.5 R
[58] Field of Search ............ 324/0.5 R, 0.5 A, 0.5 AH

[56] References Cited

U.S. PATENT DOCUMENTS

| 3,564,398 | 2/1971 | Nelson | 324/0.5 R |
| 3,873,909 | 3/1975 | Ernst | 324/0.5 A |

Primary Examiner—M. Tokar
Attorney, Agent, or Firm—Lackenbach, Lilling & Siegel

[57] ABSTRACT

A method of viewing nuclear magnetic resonance, wherein a test sample is immersed into a unidirectional polarizing magnetic field and subjected to the effect of a radio-frequency magnetic field directed at a perpendicular to the unidirectional polarizing magnetic field. The amplitude of the radio-frequency magnetic field is selected so as to exceed the average local magnetic field set by the gyromagnetic nuclei of the test sample, and the component of magnetization of the test sample longitudinal to the unidirectional polarizing magnetic field is viewed at a frequency of nuclear magnetic resonance in an effective magnetic field in a frame of reference rotating about the sense of the unidirectional polarizing magnetic field at a frequency of the above radio-frequency magnetic field in the direction of natural Larmor precession of the gyromagnetic nuclei in the test sample. The method makes it possible to appreciably increase the resolution of nuclear magnetic resonance in solids and to obtain valuable information on chemical bonds, electron-nuclear interactions and other intrinsic properties of substance.

16 Claims, 4 Drawing Figures

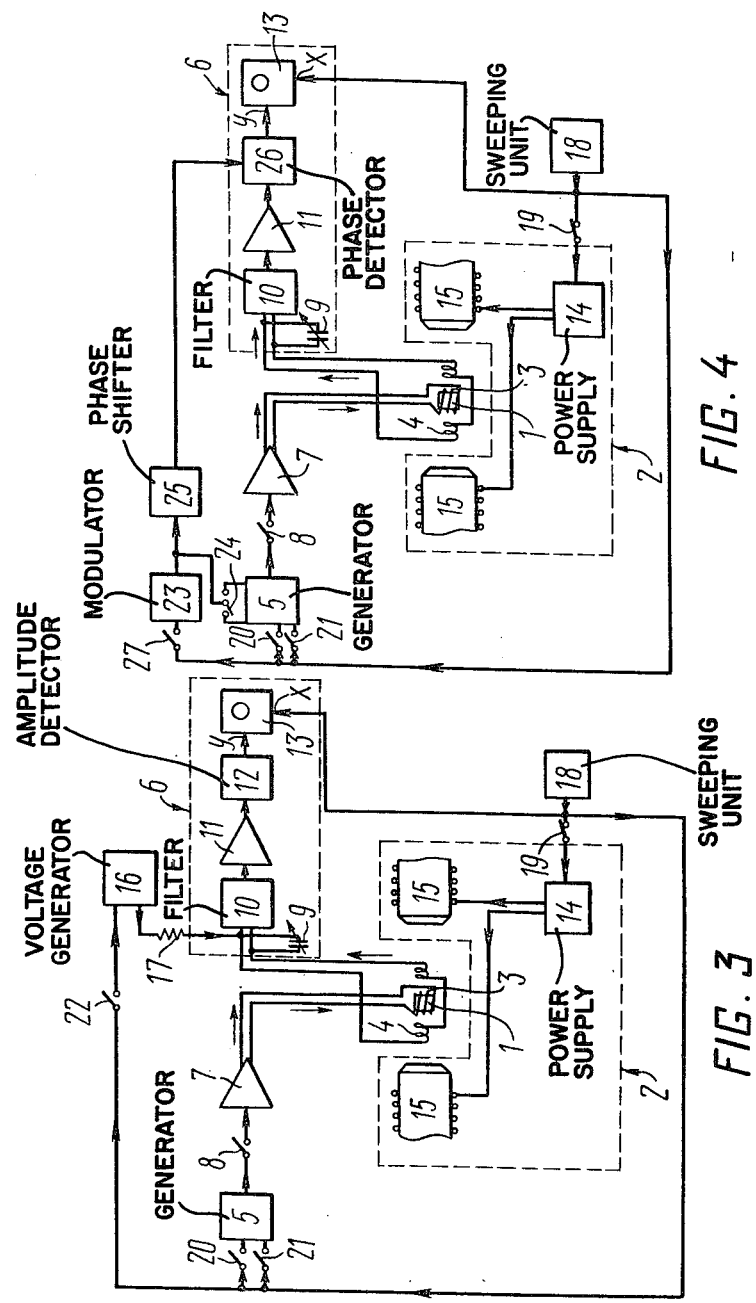

METHOD OF VIEWING NUCLEAR MAGNETIC RESONANCE

The present invention relates to a method of viewing nuclear magnetic resonance (NMR) and, in particular, to a method of providing high-resolution NMR spectra of solids. The invention can be used in various fields of physics, chemistry and biology to provide information on the intrinsic properties of substance, such as characteristics of chemical bonds, magnitude of electron-nuclear interactions, composition and structure of molecules, etc., which manifest themselves in small shifts of the NMR resonance frequency.

In many cases, particularly, in solids, these shifts which carry valuable information are obscured by dipolar spin-spin interactions between the gyromagnetic nuclei of the test material. In typical solids these interactions cause broadening of the NMR lines to $10^4$ Hz, thus appreciably limiting the resolution of conventional NMR spectrometers. The currently available methods for reducing the effects of nuclear dipolar interactions in solids require complex and costly equipment and also special interpretation of the measurement results with the aid of Fourier transformation.

The conventional well-known method of viewing NMR consists in immersing a test sample containing gyromagnetic nuclei in to a unidirectional polarizing magnetic field $H_0$, subjecting this test sample to the effect of a radio-frequency magnetic field with a frequency $\omega$ perpendicular to the sense of $H_0$, and displaying the component of magnetization of the test sample perpendicular to $H_0$ at a frequency of nuclear magnetic resonance in the field $H_0$ in accordance with the relationship $\omega_0 = \gamma H_0$, where $\gamma$ is a nuclear gyromagnetic ratio. For obtaining the NMR spectrum, one of the parameters $H_0$ or $\omega$ is swept within the range where the NMR condition is satisfied.

In accordance with the method described above, a conventional NMR spectrometer comprises a magnet which provides a polarizing magnetic field $H_0$; an inductance coil which contains a test sample and is located in the field $H_0$ so that the coil axis is perpendicular to this field; a source of radio-frequency oscillations at a frequency $\omega$, and a receiver tuned to a frequency $\omega_0$, the source of radio-frequency oscillations and the receiver being connected to the inductance coil.

The reduction of the effects of nuclear dipolar spin-spin interactions in solids has untill now been achieved by the following method.

A known method consists in mechanical rotation of a test sample about an axis which lies at a so-called "magic angle" of 54°44' to the direction of the field $H_0$. To achieve the reduction of dipolar interactions in typical solids, the rotation speed must be $10^6$ revolutions per minute which renders this method impractical for extensive use.

Another known method consists in applying to a test sample placed in a polarizing magnetic field $H_0$ a continuous radio-frequency pulse of an exciting magnetic field directed perpendicularly to $H_0$ and having an amplitude $2H_1$, the frequency $\omega$ of the exciting radio-frequency field being selected such that the relationship $\gamma H_1/(\omega - \gamma H_0) = \pm\sqrt{2}$ is fulfilled, and the value $H_1$ exceeds the average value of the local field produced by the gyromagnetic nuclei of the test sample. After the exciting radio-frequency pulse has been terminated, the NMR signal is detected by registering the component of magnetization of the sample perpendicular to $H_0$ at a frequency $\omega_0 = \gamma H_0$. The required information can be obtained only after repeating the experiment many times at different lengths of the exciting radio-frequency pulse which requires a considerable observation period. Besides, additional complex processing of the output signal (Fourier analysis) is needed to obtain a required NMR spectrum.

Another known method consists in that a test sample is placed in a polarizing field $H_0$ and is subjected to the effect of an exciting magnetic field in the form of definite sequences of short radio-frequency pulses, the time intervals between the pulses, the length, amplitude and phases of the radio-frequency oscillations in the pulses being specially programmed. The NMR signal is registered in time intervals between the pulses which makes it possible to reduce the observation time as compared with the method described above. However, the output signal obtained by this means also requires interpretation using Fourier transformation, and the realization of this method needs a highly complicated pulsed apparatus.

Known in the art are also method and devices for viewing NMR in which the component of magnetization of the test sample parallel to the field $H_0$ is registered. Thus, a known method consists in placing a test sample in a polarizing magnetic field $H_0$, subjecting this sample to the effect of a magnetic radio-frequency field which causes saturation of nuclear magnetic resonance, and after switching off this saturating field, registering the change in the component of magnetization of the sample parallel to $H_0$ which is due to nuclear spin-lattice relaxation. A respective apparatus comprises a pick-up coil which has its axis parallel to $H_0$ and is connected to a receiver tuned to a frequency of the order of $T_1^{-1}$, where $T_1$ is the time of nuclear spin-lattice relaxation (usually $T_1 \geq 10^{-3}$ sec). This method, however, fails to provide the reduction of the effect of nuclear dipolar interactions in solids.

Known in the art is also a method of viewing nuclear magnetic resonance which consists in placing a sample material containing gyromagnetic nuclei into a unidirectional polarizing magnetic field $H_0$ set up by a magnetic system; applying to this sample a radio-frequency magnetic field directed perpendicularly to the unidirectional polarizing magnetic field and set up by an exciting coil which is electrically coupled with a generator of radio-frequency oscillations; viewing the component of magnetization of the test sample longitudinal to the unidirectional polarizing magnetic field with the aid of a pick-up coil which is electrically coupled with a receiver; and viewing magnetic resonance by viewing changes in said longitudinal component of magnetization.

In the above method the frequency of the radio-frequency magnetic field is swept through the NMR region at such a rate as to meet the fast adiabatic passage condition, and said longitudinal component of magnetization is viewed by detecting its changes at a frequency determined by the rate of the fast adiabatic passage. In this method, a receiver used is a sensitive magnetometer.

The above method fails to provide the reduction of the effects of nuclear dipolar interactions which imposes restrictions on the resolution of the NMR spectrometer used for testing solids.

It is an object of the present invention to provide a method of viewing nuclear magnetic resonance which makes it possible to view nuclear magnetic resonance at a NMR frequency in the frame of reference rotating about the direction of a polarizing magnetic field at a frequency of a radio-frequency magnetic field which acts on the test sample.

It is another object of the invention to reduce the effects of nuclear dipolar spin-spin interactions and, as a result, to raise the resolution of NMR in solids.

Still another object of the invention is viewing of NMR directly in the form of a frequency spectrum.

To achieve the foregoing objects, a method of viewing nuclear magnetic resonance, comprising the steps of: immersing a test sample of material containing gyromagnetic nuclei into a unidirectional polarizing magnetic field set up by a magnetic system; subjecting this test sample to the effect of a radio-frequency magnetic field directed perpendicularly to the unidirectional polarizing magnetic field and set up by an exciting coil which is electrically coupled with a generator of radio-frequency oscillations; selecting an amplitude of said radio-frequency magnetic field so as to exceed the average local magnetic field set up by the gyromagnetic nuclei in the test sample, viewing the component of magnetization of the test sample longitudinal towards the unidirectional polarizing magnetic field with the aid of a pick-up coil which is electrically coupled with a receiver; according to the invention, comprises also the steps of viewing changes in said longitudinal component of magnetization at a frequency of nuclear magnetic resonance in an effective magnetic field $H_{ef}$, the magnitude whereof is calculated from the relationship:

$$H_{ef} = \sqrt{(H_0 - \frac{\omega}{\gamma})^2 + H_1^2},$$

where $H_0$ = intensity of the unidirectional polarizing magnetic field,
$H_1$ = half amplitude of the radio-frequency magnetic field,
$\omega$ = frequency of the radio-frequency magnetic field,
$\gamma$ = gyromagnetic ratio of nuclei in the test sample,
and viewing nuclear magnetic resonance by changes in said longitudinal component of magnetization, said longitudinal component of magnetization being viewed with a receiver tuned to the frequency of nuclear magnetic resonance in said effective magnetic field.

It is expedient that the frequency of the radio-frequency magnetic field be selected so as to meet the condition:

$$\omega = \gamma (H_0 \pm \frac{H_1}{\sqrt{2}}).$$

It is advantageous that said longitudinal component of magnetization of the test sample be viewed by additionally subjecting this test sample to the effect of an alternating magnetic field at a frequency $\Omega$ which is directed in parallel to the unidirectional polarizing magnetic field and set up by said pick-up coil electrically coupled with a generator of electrical oscillations at a frequency $\Omega$, and by sweeping at least one of the parameters $H_0$, $H_1$, $\omega$, $\Omega$ within the range where the resonance condition:

$$\Omega = \gamma H_{ef}$$

is satisfied.

It is advisable that the parameters $H_0$, $H_1$, $\omega$, $\Omega$ be selected so as to simultaneously satisfy the relationships:

$$\Omega = \gamma H_{ef},$$

$$\omega = \gamma (H_0 \pm \frac{H_1}{\sqrt{2}}).$$

It is also expedient that said longitudinal component of magnetization of the test sample be viewed through modulating the frequency or the amplitude of said radio-frequency magnetic field at a frequency $\Omega_m$ by a modulator electrically connected to said generator of electrical oscillations, and through sweeping at least one of the parameters $H_0$, $H_1$, $\omega$, $\Omega_m$ within the range where the resonance condition $$\Omega_m = \gamma H_{ef}$$

is satisfied.

It is advisable that the parameters $H_0$, $H_1$, $\omega$, $\Omega_m$ be selected so as to simultaneously the relationships:

$$\Omega_m = \gamma H_{ef},$$

$$\omega = \gamma (H_0 \pm \frac{H_1}{\sqrt{2}}).$$

The preferred method of viewing nuclear magnetic resonance makes it possible, using simple means and within a short time, to appreciably increase the resolution of NMR in solids and, as a result, to provide valuable information on chemical bonds, electron-nuclear interactions and other internal properties of substances. The preferred method makes it also possible to provide new effective methods for physical investigation of dynamic and relaxation processes in nuclear spin systems.

The invention will be made clear by the following description of preferred embodiments thereof when read in conjunction with the accompanying drawings, in which:

FIG. 3 is a block diagram of another embodiment of the apparatus for carrying into effect the proposed method, according to the invention;

FIG. 4 is a block diagram of a third embodiment of the apparatus for carrying into effect the proposed method, according to the invention.

Consider a material containing gyromagnetic nuclei which is placed in a static magnetic field $H_0$ directed along the Z-axis of the Cartesian coordinate system. The movement of the magnetic moments in this field is Larmor precession about the Z-axis at an angular frequency $\omega_0 = \gamma H_0$, where $\gamma$ is a nuclear gyromagnetic ratio. Assume that the strength of the field $H_0$ is sufficiently large to provide noticeable magnetization of the magnetic moments, i.e. the orientation of their Z-components in the direction of $H_0$ (typical values of $H_0$ are $10^3$ to $10^{-4}$ oersted).

Further, apply to this material a radio-frequency magnetic field with a frequency $\omega$ close to $\omega_0$, and an amplitude $2H_1$ is directed perpendicular to the Z-axis. In order to describe the movement of the magnetic moments in these conditions, it is convenient to change to a frame of reference which rotates about the Z-axis in the direction of the Larmor precession of the nuclei at a frequency $\omega$.

Figure 1:
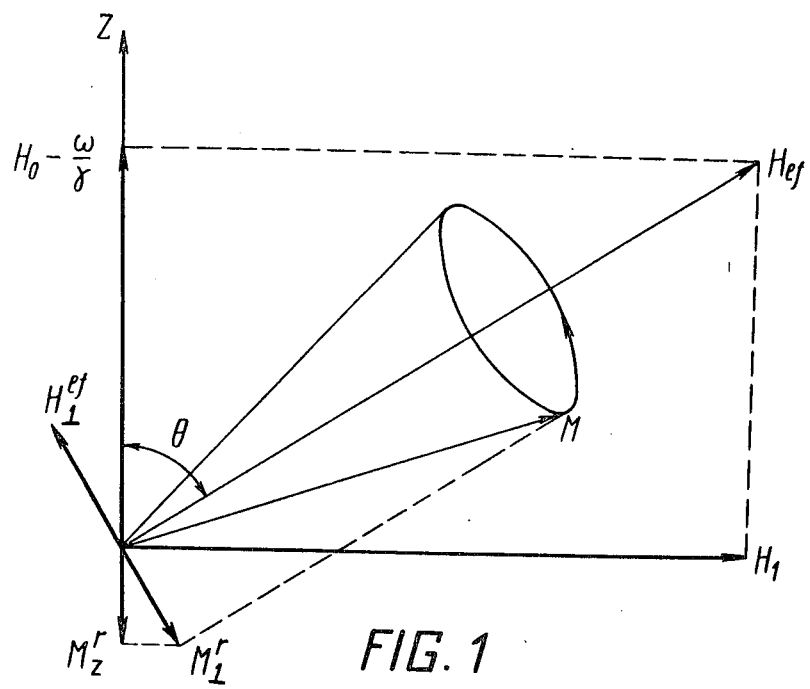
FIG. 1 is a vector representation of magnetic fields and magnetization of the test sample in a rotating frame of reference, according to the invention.

The vector representation of magnetic fields in the rotating frame of reference is illustrated in FIG. 1.

In FIG. 1, the Z-axis indicates the sense of a polarizing magnetic field $H_0$; vectors $H_1$ and $H_0 - (\omega/\gamma)$ denote, respectively, the transverse and longitudinal (relative to the Z-axis) components of the magnetic field in the rotation frame of reference; vector $H_{ef}$ is an effective magnetic field in this frame of reference; $\theta$ is an angle between $H_{ef}$ and the Z-axis; M is nuclear magnetization of a test sample which precesses about $H_{ef}$; $M_\perp^r$ is a component of the vector M in the sense perpendicular to $H_{ef}$, $M_z^r$ is a projection of the vector $M_\perp^r$ onto the Z-axis; vector $H_\perp^{ef}$ is a component of an additional alternating magnetic field at a frequency $\Omega$ perpendicular to the sense of $H_{ef}$.

In such a rotating frame, said radio-frequency field becomes a static magnetic field with strength $H_1$, and the magnetic field $H_0$ is reduced to the value $H_0 - (\omega/\gamma)$ (FIG. 1). The resulting effective magnetic field $H_{ef}$ in the rotating frame is, consequently, equal to $$H_{ef} = \sqrt{(H_0 - \frac{\omega}{\gamma})^2 + H_1^2}$$

and is inclined to the Z-axis at an angle $\theta$ equal to:

$$\Theta = \arccos\left(\frac{H_0 - \frac{\omega}{\gamma}}{H_{ef}}\right).$$

In the rotating frame of reference, nuclear magnetic moments undergo Larmor precession about the direction $H_{ef}$ (FIG. 1) at an angular frequency $$\Omega_0 = \gamma H_{ef}$$

At this frequency the well-known nuclear magnetic resonance must occur in the rotating frame, the viewing of this phenomenon being the object of the present invention.

For viewing NMR in the rotating frame, it is necessary to register the component $M_\perp^r$ of magnetization M of the sample which is perpendicular to the direction of $H_{ef}$ (FIG. 1).

In FIG. 1 it can be seen that rotation of the vector $M_\perp^r$ about $H_{ef}$ at the angular frequency $\Omega_0$ causes the appearance of the component $M_z^r$ of magnetization which is longitudinal relative to the Z-axis and oscillates at the same frequency $\Omega_0$. The viewing of this longitudinal component at the frequency $\Omega_0$ is the subject of the invention.

If a radio-frequency magnetic field is applied to a sample abruptly, this causes the damped precession of the equilibrium magnetization of the sample around the sense of $H_{ef}$ which induces in the above-mentioned pick-up coil damped oscillations at a frequency $\Omega_0$. The waveform of these oscillations is the Fourier transform of the NMR frequency spectrum.

For viewing NMR in the rotating frame using stationary means, it is necessary to apply to the test sample a weak (non-saturating) alternating magnetic field with a frequency $\Omega$ equal or close to $\Omega_0$ which has the non-zero component $H_\perp^{ef}$ perpendicular to the sense of $H_{ef}$ (FIG. 1). Such a field can be induced by a coil the axis of which is parallel to Z, or through modulating the frequency $\omega$ of the radio-frequency magnetic field at a frequency $\Omega_m \simeq \Omega_0$ which will result in a respective modulation of the value $H_0 - (\omega/\gamma)$ of the Z-component of the field $H_{ef}$ and in the appearance of the required variable component $H_\perp^{ef}$. The same result can also be obtained, as can be seen from FIG. 1, by modulating the value of $H_1$, i.e. the amplitude of the radio-frequency magnetic field, if $\theta \neq (\pi/2)$.

In all these cases direct viewing of the required NMR spectrum can be accomplished through sweeping at least one of the parameters $H_0$, $\omega$, $H_1$, $\Omega$, $\Omega_m$ within the range where the resonance condition $$\Omega = \gamma H_{ef} \text{ or } \Omega_m = \gamma H_{ef}$$

in the rotating frame is satisfied.

It is well known that in the rotating frame nuclear dipolar spin-spin interactions are partially damped (see, for instance, A. G. Redfied, Physical Review, 98, 1787 /1955/). Therefore, viewing of NMR with the aid of the proposed method causes narrowing of the NMR spectrum lines in solids and, consequently, increases the resolution of an NMR spectrometer. The maximum reduction of nuclear dipolar interactions occurs on the condition that:

$$\theta = \theta_m = \arccos 1/\sqrt{3},$$

where $\theta_m = 54°44'$, i.e. the so-called "magic angle". Here, the value of $H_1$ must exceed the average strength of the local magnetic field $H_L$ set up by the gyromagnetic nuclei of the test sample.

It follows from FIG. 1 that for the condition $\theta = \theta_m$ to be satisfied, the parameters of the polarizing and radio-frequency magnetic fields must be selected according to the relationship:

$$\omega = \gamma \left(H_0 \pm \frac{H_1}{\sqrt{2}}\right),$$

which must be satisfied simultaneously with the above resonance condition in the rotating frame of reference.

In order to have the maximum amplitude of the viewed NMR signal in the rotating frame, the maximum nuclear magnetization of the test sample must be maintained during the experiment. For this purpose, it is recommended that the duration of the experiment should be shorter than the nuclear spin-lattice relaxation time.

Below are given typical values of the parameters used. For an ordinary solid containing hydrogen or fluorine nuclei, $\gamma/2\pi \approx 4.10^3$ Hz/Oe, $H_L \approx 1$ Oe. In the field $H_0 = 10^4$ Oe the frequency $\omega_0/2\pi \approx 40$ MHz which corresponds to the range of a typical conventional NMR spectrometer. Selecting $H_1 = 20-100$ Oe and using the condition $\theta = \theta_m$, we obtain $H_{ef} \approx 25-125$ Oe and $\Omega_0 = \gamma H_{ef} \approx 100-500$ kHz. At these levels of the parameters, the effect of nuclear dipolar interactions is reduced 100 to 1000 times.

A test sample 1 (FIG. 2) of a material containing gyromagnetic nuclei (a CaF$_2$ crystal in the embodiment being described) is immersed into a unidirectional polarizing magnetic field H$_0$ shown in the drawing by an arrow, which is set up by a magnetic system 2 of an apparatus for carrying into effect the method of NMR viewing. The sample 1 is inside an exciting coil 3 and a pick-up coil 4 of the above apparatus.

The axis of the exciting coil 3 is oriented perpendicular to the field H$_0$, and the coil 3 itself is electrically connected to a generator 5 of radio-frequency oscillations at a frequency $\omega$. The axis of the pick-up coil 4 is oriented parallel to the field H$_0$, and the coil 4 itself is connected to an input of a receiver 6 tuned to a frequency $\Omega_0$ of nuclear magnetic resonance in the effective magnetic field H$_{ef}$(FIG. 1) in a frame of reference rotating around H$_0$ with the frequency $\omega$ in the direction of the Larmor precession of the nuclei in the sample I, where H$_{ef}$ is found from the relationship:

$$H_{ef} = \sqrt{(H_0 - \frac{\omega}{\gamma})^2 + H_1^2}.$$

In the second embodiment of the apparatus, electrical coupling of the generator 5 (FIG. 2) with the coil 3 is through a power amplifier 7 (FIG. 3) tuned to the frequency $\omega$ of the generator 5, and through a switch 8 which connects the output of generator 5 to the input of the amplifier 7. The power amplifier 7 is of well-known design, for example, of the type described by Jones, Donglass and McCall, Review of Scientific Instruments, 36, 1460/1975.

In the described embodiment, the receiver 6 comprises a variable capacitor 9 which is connected in parallel with the coil 4 and forms with the coil a resonance circuit tuned to a frequency $\Omega_0$. The coil 4 and the capacitor 9 are connected to the input of a low-pass LC-filter 10 which provides undistorted passage of signals at the frequency $\Omega_0$ and suppression of signals at the frequency $\omega$. The output of the LC-filter 10 is connected to the input of a resonance amplifier II tuned to the frequency $\Omega_0$. The output of the amplifier II is connected to the input of an amplitude detector 12 the output of which is connected to the Y-input of a display device 13 (an oscilloscope in the preferred embodiment of the invention).

The magnetic system 2 comprises a power supply unit 14 of well-known design, for example, of the type V-FR 2503 Fieldial Mark I, produced by Varian in the USA, connected to the winding of a conventional electromagnet 15.

For obtaining a nuclear magnetic resonance spectrum on the screen of the display device 13, the above circuit comprises additionally a conventional A.C. voltage generator 16 operating at a frequency $\Omega$ which is connected through a resistor 17 to the coil 4. The resistance of the resistor 17 exceeds the active equivalent resistance of the resonance circuit formed by the coil 4 and the variable capacitor 9, at the frequency $\Omega_0$.

The circuit also comprises a sweeping unit 18 which is basically a conventional infrasonic-frequency A.C. generator. The unit 18 is connected via a switch 19 to an input of the external control device of the power supply unit 14, via switches 20 and 21 to control inputs regulating, respectively, the oscillation frequency and amplitude of the generator 5, and via a switch 22 to the frequency control input of the generator 16. Besides, the output of the sweeping unit 18 is connected to the X-input of the display device 13.

The third embodiment of the apparatus for viewing nuclear magnetic resonance employs a circuit similar to that described above.

Its difference is that it comprises a modulator 23 (FIG. 4) which is basically a conventional A.C. voltage generator operating at a frequency $\Omega_m$. For modulating the frequency or the amplitude of the radio-frequency magnetic field, the output of the modulator 23 is connected via a switch 24, respectively, to the frequency or amplitude modulation inputs of the generator 5. Besides, the output of the modulator 23 is connected via a conventional phase shifter 25 to the control input of a phase detector 26 which is used in this embodiment of the apparatus instead of the amplitude detector 12 (FIG. 3).

For sweeping the modulation frequency $\Omega_m$ the output of the sweeping unit 18 is connected via a switch 27 to a frequency control input of the modulator 23.

According to the invention, nuclear magnetic resonance is viewed as follows.

Figure 2:
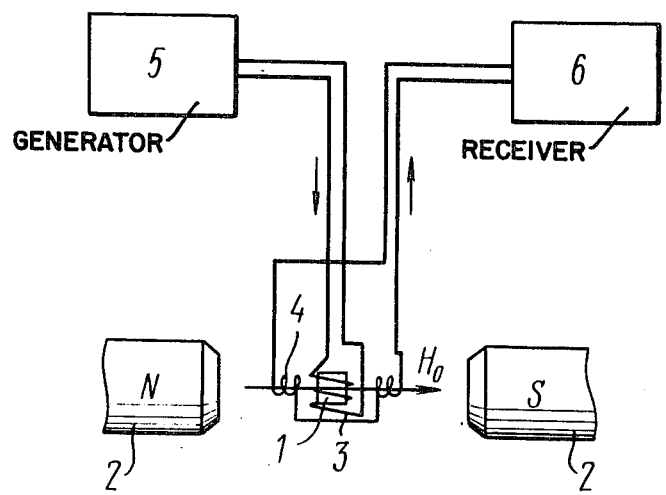
FIG. 2 is a block diagram of an apparatus for carrying into effect the proposed method of viewing NMR, according to the invention.

The test sample 1 (FIG. 2) is immersed into a unidirectional polarizing magnetic field H$_0$ set up by the magnetic system 2. The purpose of the magnetic field H$_0$ is to cause polarization of nuclear magnetic moments in the sample 1. Radio-frequency voltage is applied at a frequency $\omega$ from the generator 5 to the exciting coil 3, thereby inducing at the sample 1 a radio-frequency magnetic field at the frequency $\omega$ oriented perpendicularly to the field H$_0$, the amplitude of this radio-frequency magnetic field being selected so as to exceed the average magnitude of a local magnetic field caused by the gyromagnetic nuclei of the sample 1. The precession of nuclear magnetization of the sample 1 in the effective magnetic field H$_{ef}$ (FIG. 1) in the rotating frame of reference causes the appearance of the component of magnetization of the sample 1 longitudinal to the field H$_0$ (FIG. 2). The component of magnetization oscillates at a frequency $\Omega_0 = \gamma H_{ef}$ of nuclear magnetic resonance in the effective field H$_{ef}$. Nuclear magnetic resonance is viewed by detecting this longitudinal component with the aid of the pick-up coil 4 in which the NMR signal at a frequency $\Omega_0$ is induced. This signal goes to the receiver 6 tuned to the frequency $\Omega_0$ where it is amplified, detected and observed or recorded.

The NMR signal at the frequency $\Omega_0$ can be registered by any known means used in NMR spectroscopy, for instance, by the free induction, spin echo, fast adiabatic passage, steady-state absorption or dispersion methods. Certain versions of registrating are illustrated in FIGS. 3, 4.

The free induction method consists in closing a switch 8 (FIG. 3) to apply radio-frequency voltage at a frequency $\omega$ from the generator 5 through the power amplifier 7 to the exciting coil 3. Immediately following this delivery of voltage, damped oscillations of the frequency $\Omega_0$ are induced in the pick-up coil 4 and are sent to the receiver 6. In this case additional processing of the output signal by Fourier transformation is required to obtain a desired NMR spectrum.

The same means may be used for viewing NMR during pulsed operation of the generator 5 according to any preset program.

Steady-state methods are recommended for direct viewing of a required NMR spectrum. One of such methods, a so-called method of a "Q-meter" (see, for example, E. Andrew, Nuclear Magnetic Resonance, Cambridge, 1955) is illustrated in FIG. 3.

Alternating voltage of a frequency generated by the generator 16 is delivered through the resistor 17 to the pick-up coil 4. The resistor 17 is intended to prevent shunting of the resonance circuit formed by the coil 4 and the capacitor 9 by the internal resistance of the generator 16. The above voltage induces at the sample 1 an alternating magnetic field of a frequency $\Omega$ oriented parallel to the polarizing magnetic field $H_0$.

In these conditions at least one of the parameters $H_0$, $\omega$, $H_1$, $\Omega$ is swept within the range where the resonance condition in the rotating frame:

$$\Omega = \gamma H_{ef}$$

is satisfied.

According to the means shown in FIG. 3, the parameter $H_0$ is swept. For this purpose, infrasonic frequency voltage at a frequency of, for example, 0.5 Hz, is applied from the sweeping unit 18 through a closed switch 19 to the power supply unit 14 of the electromagnet 15 causing periodic changes in the value of the magnetic field $H_0$ in the above range. When the field $H_0$ passes through the resonance condition, the energy of the alternating magnetic field with a frequency $\Omega = \Omega_0$ is absorbed in the sample 1. The resulting voltage change at the resonance circuit formed by the coil 4 and the capacitor 9 passes through the low-pass filter 10 which suppresses leakage of the radio-frequency signal at a frequency $\omega$, is amplified in the amplifier 11 and detected by the amplitude detector 12. From the output of the detector 12, the signal is applied to the Y-input of the display device 13.

At the same time, a sweep voltage is applied from the sweeping unit 18. As a result, a required NMR spectrum can be viewed directly on the display device 13.

For sweeping other said parameters $\omega$, $H_1$, $\Omega$ or for simultaneous sweeping of several parameters, the switches 20, 21, 22, respectively, are closed. In this case, the NMR spectrum is viewed in the same way as when sweeping the parameter $H_0$.

Another version of the proposed method is illustrated in FIG. 4. In this version, the frequency or the amplitude of the radio-frequency magnetic field of a frequency $\omega$ is modulated at a frequency $\Omega_m$ for viewing a NMR spectrum. Voltage at a frequency $\Omega_m$ is applied from the modulator 23 through the switch 24 to the frequency or amplitude modulation inputs of the generator 5. In this version, the position of the switch 24 corresponds to frequency modulation.

Frequency-modulated radio-frequency oscillations from the generator 5 are amplified, after closure of the switch 8, in the power amplifier 7 and applied to the exciting coil 3. If the resonance condition $\Omega_m = \gamma H_{ef}$ is satisfied which is made possible through the above sweeping of $H_0$, a NMR signal is induced in the coil 4 at a frequency $\Omega_m = \Omega_0$, applied to the receiver 6 and registered in the way described above. In contrast to the circuit of FIG. 3, in FIG. 4 the amplitude detector 12 is replaced by the phase discriminator 26 which is controlled by $\Omega_m$-frequency reference voltage fed from the modulator 23 through the phase shifter 25. The phase of the reference voltage is selected so as to enable display of a signal propertional either to the real part of the resonant magnetic susceptibility at a frequency $\Omega_m$ (a dispersion signal) or to the imaginary part of this susceptibility (an absorption signal).

The NMR spectrum is viewed in the same way when sweeping the modulation frequency $\Omega_m$, for which purpose voltage from the output of the sweeping unit 18 is applied to the frequency control input of the modulator 23 by closing the switch 27.

When viewing NMR using any of the described method, in order to achieve maximum reduction of the effects of nuclear dipolar interactions and maximum resolution of the NMR spectrometer, the parameters of the polarizing and alternating magnetic fields must be selected so as to satisfy at the same time the "magic angle" condition: $\omega = \gamma(H_0 \pm H_1/\sqrt{2})$, and the condition of resonance in the rotating frame of reference:

$$\Omega = \gamma H_{ef} \text{ or } \Omega_m = \gamma H_{ef}.$$

For meeting both conditions simultaneously, it is necessary to preselect appropriate relationships between the parameters which do not change during the experiment. Thus, if the frequency $\Omega$ is swept, the parameters $\omega$, $H_0$ and $H_1$ are preselected in accordance with the above "magic angle" condition; if the value of $H_0$ or frequency $\omega$ is swept, the parameters $H_1$ and $\Omega$ must be preadjusted to satisfy the relationship $$\Omega \sqrt{2} = \gamma H_1 \sqrt{3}$$

which follows directly from simultaneous satisfaction of the two above conditions.

Simultaneous sweeping of several parameters is also possible, for example, sweeping of the parameters $H_0$ and $H_1$ in such a way as to meet the above "magic angle" condition throughout the experiment.

The entire experiment must be completed within the time shorter than the time of spin-lattice relaxation of the gyromagnetic nuclei in the test sample.

Thus, the method of viewing NMR according to the invention makes it possible to increase the resolution of NMR spectra, particularly in solids without using complex and costly pulsed apparatus and the Fourier transformation of the output signal. High-resolution NMR spectra are provided using traditional well-designed steady state methods noted for simplicity, reliability and low costs.

What is claimed is:

1. A method of viewing nuclear magnetic resonance, comprising the steps of: establishing a unidirectional polarizing magnetic field having an intensity $H_0$; immersing a test sample of a material containing gyromagnetic nuclei into said unidirectional polarizing magnetic field set up by a magnetic system; establishing a radio-frequency magnetic field directed perpendicularly to said unidirectional polarizing magnetic field and having an amplitude $2H_1$; subjecting said test sample to the effect of a radio-frequency magnetic field selecting the amplitude of said radio-frequency magnetic field so as to exceed the average local magnetic field induced by the gyromagnetic nuclei of said sample; viewing the component of magnetization of said test sample longitudinal to said unidirectional polarizing magnetic field at a frequency of nuclear magnetic resonance in an effective magnetic field $H_{ef}$ the value whereof is calculated from the relationship:

$$H_{ef} = \sqrt{(H_0 - \frac{\omega}{\gamma})^2 + H_1^2}.$$

where $H_0$ = intensity of said unidirectional polarizing magnetic field, $H_1$ = half amplitude of said radio-frequency magnetic field, $\omega$ = frequency of said radio-frequency magnetic field, $\gamma$ = gyromagnetic ratio of nuclei in said test sample; viewing said longitudinal components of magnetization with the aid of a pick-up coil which is electrically coupled to a receiver tuned to the frequency of nuclear magnetic resonance in said effective magnetic field; and viewing of nuclear magnetic resonance by changes in said longitudinal component of magnetization.

2. A method as set forth in claim 1, further comprising the step of setting the frequency of said radio-frequency magnetic field according to the relationship:

$$\omega = \gamma (H_0 \pm \frac{H_1}{\sqrt{2}}).$$

3. A method as set forth in claim 1, wherein said step of viewing said longitudinal component of magnetization of said test sample is achieved by subjecting said test sample to the effect of said radio-frequency magnetic field and at the same time to an alternating magnetic field at a frequency $\Omega$ which is oriented parallel to said unidirectional polarizing magnetic field and set up by said pick-up coil electrically coupled to a generator of electrical oscillations at a frequency $\Omega$, said viewing being accomplished by subjecting said test sample to the effect of said alternating magnetic field and at the same time sweeping at least one of the parameters $H_0$, $H_1$, $\omega$, $\Omega$ within the range where the resonance condition:

$$\Omega = \gamma H_{ef}$$

is satisfied.

4. A method as set forth in claim 1, wherein said step of viewing said longitudinal component of magnetization of said test sample is achieved by modulating, at a frequency $\Omega_m$, the frequency of said radio-frequency magnetic field by means of a modulator electrically connected to said generator of radio-frequency oscillations, said viewing being accomplished by said modulation and simultaneous sweeping of at least one of the parameters $H_0$, $H_1$, $\omega$, $\Omega_m$ within the range where the resonance condition:

$$\Omega_m = \gamma H_{ef}$$

is satisfied.

5. A method as set forth in claim 1, wherein said step of viewing said longitudinal component of magnetization of said test sample is achieved by modulating, at a frequency $\Omega_m$, the amplitude of said radio-frequency magnetic field by a modulator which is electrically connected to said generator of radio-frequency oscillation, said viewing being accomplished by said modulation and simultaneous sweeping of at least one of the parameters $H_0$, $H_1$, $\omega$, $\Omega_m$ within the range where the resonance condition:

$$\Omega_m = \gamma H_{ef}$$

is satisfied.

6. A method as set forth in claim 3, which further comprising the step of selecting said parameters $H_0$, $H_1$, $\omega$, $\Omega$ so as to simultaneously satisfy the relationships:

$$\Omega = \gamma H_{ef},$$

$$\omega = \gamma (H_0 \pm \frac{H_1}{\sqrt{2}}).$$

7. A method as set forth in claim 4, further comprising the step of selecting said parameters $H_0$, $H_1$, $\omega$, $\Omega_m$ so as to simultaneously satisfy the relationships:

$$\Omega_m = \gamma H_{ef},$$

$$\omega = \gamma (H_0 \pm \frac{H_1}{\sqrt{2}}).$$

8. A method as set forth in claim 5, further comprising the step of selecting said parameters $H_0$, $H_1$, $\omega$, $\Omega_m$ so as to simultaneously satisfy the relationships:

$$\Omega_m = \gamma H_{ef},$$

$$\omega = \gamma (H_0 \pm \frac{H_1}{\sqrt{2}}).$$

9. A method as set forth in claim 1, wherein said radio-frequency magnetic field is established by exciting a coil which is electrically connected to a generator of radio-frequency oscillations.

10. A method of viewing nuclear magnetic resonance, comprising the steps of: immersing a test sample of a material containing gyromagnetic nuclei into a unidirectional polarizing magnetic field set up by a magnetic system; subjecting said test sample to the effect of a radio-frequency magnetic field directed perpendicularly to said unidirectional polarizing magnetic field and set up by an exciting coil which is electrically connected to a generator of radio-frequency oscillations; selecting the amplitude of said radio-frequency magnetic field so as to exceed the average local magnetic field induced by the gyromagnetic nuclei of said sample; viewing the component of magnetization of said test sample longitudinal to said unidirectional polarizing magnetic field at a frequency of nuclear magnetic resonance in a predetermined effective magnetic field in the frame of reference rotating about the direction of said unidirectional polarizing magnetic field at a frequency of said radio-frequency magnetic field, the magnitude of said effective magnetic field being a function of the amplitudes or intensities of said unidirectional polarizing magnetic and radio-frequency magnetic fields; viewing said longitudinal component of magnetization with the aid of a pick-up coil which is electrically coupled to a receiver tuned to the frequency of nuclear magnetic resonance in said effective magnetic field; and viewing of nuclear magnetic resonance by changes in said longitudinal component of magnetization.

11. Apparatus for viewing nuclear magnetic resonance comprising: a magnetic system for producing a unidirectional polarizing magnetic field having an intensity $H_0$; a generator of radio-frequency oscillations at frequency $\omega$ and having frequency and amplitude control inputs; an exciting coil, connected to the said generator of radio-frequency oscillations, for producing a radio-frequency magnetic field having an amplitude $2H_1$ and directed perpendicularly to said unidirectional polarizing magnetic field $H_0$; a pick-up coil disposed with its axis parallel to the said unidirectional polarizing magnetic field $H_0$ and connected into a resonance circuit tuned to frequency $\Omega_0 = \gamma H_{ef}$ of nuclear magnetic resonance where $\gamma$ = gyromagnetic ratio of nuclei in a test sample, and $H_{ef}$ = effective magnetic field; and a receiver tuned to said frequency $\Omega_0$ and connected to the said resonance circuit.

12. Apparatus as set forth in claim 11, comprising: a generator of electrical oscillations at frequency $\Omega$ coupled to the said pick-up coil and having a frequency control input; and a unit for sweeping at least one of said parameters $H_0$, $H_1$, $\omega$, $\Omega$ connected to said frequency and amplitude control inputs of the said generator of radio-frequency oscillations and to said frequency control input of the said generator of electrical oscillations at frequency $\Omega$.

13. Apparatus as set forth in claim 12, wherein said sweeping unit is connected to said control inputs through switches.

14. Apparatus as set forth in claim 12, wherein said magnetic system includes a power supply having an external control input, said sweeping unit being connected to said external control input of said power supply.

15. Apparatus as set forth in claim 11, comprising: a modulator including an alternating current voltage generator of frequency $\Omega_m$ having a frequency control input and connected to the frequency and amplitude inputs of the said generator radio-frequency oscillations; and a unit for sweeping at least one of the parameters $H_0$, $H_1$, $\omega$, $\Omega_m$ connected to said frequency and amplitude control inputs of the said generator of radio-frequency oscillations and to said frequency control input of the said modulator.

16. Apparatus as set forth in claim 15, wherein said current voltage generator and said sweeping unit are connected to their respective control inputs through switches.

* * * * *